Figure 1:
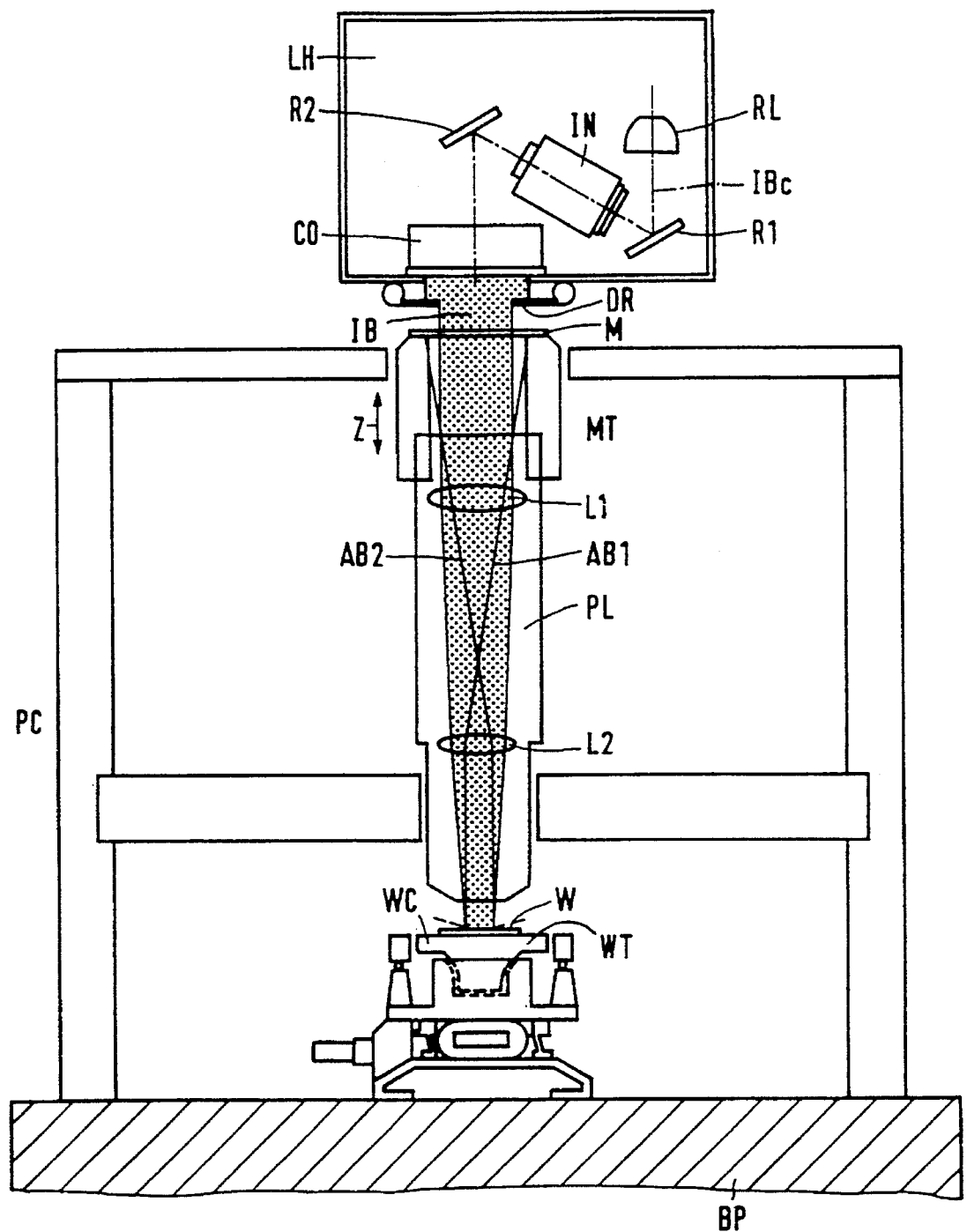

United States Patent [19]

Straaijer et al.

[11] Patent Number: 5,602,683
[45] Date of Patent: Feb. 11, 1997

[54] LENS SYSTEM WITH LENS ELEMENTS ARRANGED IN A GAS-FILLED HOLDER AND PHOTOLITHOGRAPHIC APPARATUS INCLUDING SUCH A SYSTEM

[75] Inventors: Alexander Straaijer, Eindhoven; Jan W. D. Martens, Veldhoven, both of Netherlands

[73] Assignee: ASM Lithography, La Veldhoven, Netherlands

[21] Appl. No.: 361,082

[22] Filed: Dec. 21, 1994

[30] Foreign Application Priority Data

Dec. 24, 1993 [BE] Belgium ................................. 0931456

[51] Int. Cl.$^6$ .................................................... G02B 7/02
[52] U.S. Cl. .................... 359/811; 359/350; 359/809; 359/894; 359/507; 355/67
[58] Field of Search ................. 359/232, 350, 359/355, 507, 655, 665, 667, 820, 894, 808, 809, 811; 101/131, 450.1, 470, 471; 422/186.07, 186.1, 186.12; 423/581; 250/431, 432 R, 492.22; 356/400, 401; 355/67

[56] References Cited

U.S. PATENT DOCUMENTS

| | | | |
|---|---|---|---|
| 2,478,955 | 8/1949 | Vicklund | 359/507 |
| 4,616,908 | 10/1986 | King | 359/505 |
| 4,992,169 | 2/1991 | Izumiya | 210/221.2 |
| 5,100,237 | 3/1992 | Wittekoek et al. | 356/401 |
| 5,144,363 | 9/1992 | Wittekoek et al. | 355/53 |
| 5,191,200 | 3/1993 | van der Werf et al. | 250/201.4 |
| 5,344,522 | 9/1994 | Yagi et al. | 156/628 |

FOREIGN PATENT DOCUMENTS

| | | |
|---|---|---|
| 0467445 | 1/1992 | European Pat. Off. . |
| 0498499 | 8/1992 | European Pat. Off. . |

OTHER PUBLICATIONS

H. L. Stover, "Optical Microlithography IV", Proceedings of SPIE—The International Society for Optical Engineering, vol. 538, Mar. 13–14, 1985, pp. 86–90.

Primary Examiner—Paul M. Dzierzynski
Assistant Examiner—Darren E. Schuberg
Attorney, Agent, or Firm—Arthur G. Schaier

[57] ABSTRACT

A high-quality lens system (PL) is described, which system is rinsed with a gas having a low refractive index so as to reduce the influence of variations of ambient parameters on the optical behaviour. By adding a very small quantity of ozone to this gas, it is prevented that any deposit will be produced on the lens elements within the lens holder (PLH) as a result of decomposition of organic particles caused by UV radiation and precipitation of the decomposition products.

4 Claims, 2 Drawing Sheets

LENS SYSTEM WITH LENS ELEMENTS ARRANGED IN A GAS-FILLED HOLDER AND PHOTOLITHOGRAPHIC APPARATUS INCLUDING SUCH A SYSTEM

The invention relates to a lens system comprising a plurality of lens elements arranged in a lens holder which is connected to a device for maintaining the holder filled with a gas having a low refractive index. The invention also relates to a photolithographic imaging apparatus including such a lens system.

BACKGROUND OF THE INVENTION

Such an apparatus including a lens system and intended to manufacture integrated semiconductor circuits is known from U.S. Pat. No. 5,100,237. In this apparatus a mask is illuminated and imaged in a repetitive manner on a photoresist layer provided on a semiconductor substrate. A large number of ICs must be formed on the substrate. After an image of the mask has been formed on the substrate, this substrate is to this end displaced with respect to the mask by a distance which is slightly larger than the length or the width of the ICs to be formed, whereafter a subsequent mask image is made, and so forth. It is desirable that the illumination beam then has an intensity which is as high as possible so that the illumination time for each IC is as short as possible and the time of passage of the substrate through the apparatus, i.e. the time required to illuminate all ICs is as short as possible. Consequently, in addition to a radiation source having a high radiation power, a projection lens system having a high transmission must be used.

To be able to make mask images having very small details, for example with line widths of the order of 0.25 μm, not only very strict requirements should be imposed on the optical quality of the projection lens system, notably on their resolving power, but also the wavelength of the illumination beam should be as small as possible. To this end an illumination system is used which emits radiation at a wavelength in the ultraviolet (UV) range, for example I-line radiation with a wavelength of 365 nm from a mercury vapour lamp or radiation with a wavelength of 243 nm from an excimer laser.

It has been found that the medium within the lens holder is contaminated with organic molecules. These molecules originate from the adhesive with which the lens elements are secured in the holder, of which adhesive a part may evaporate. Moreover, in production circumstances, the ambient air is contaminated with organic molecules which originate for example, from the adhesive layer between the substrate and the photoresist, which molecules may penetrate the lens holder. Although the organic molecules are only present in a small concentration within the lens holder, they may have a disastrous influence on the projection lens system. In fact, such particles may decompose under the influence of the UV illumination beam and subsequently precipitate on the lens elements, forming a carbon or carbon-containing film on these elements so that the effective transmission of these elements will decrease considerably in the course of time.

The projection lens system is a complicated and expensive part of the projection apparatus. The assembly of such a system is complicated and time-consuming. After the system has been assembled, it can no longer be disassembled to clean its components by hand or by mechanical means.

If the medium within the lens holder were air or oxygen, the contaminating organic molecules could be converted via oxidation into carbon dioxide and be depleted by rinsing the lens holder with one of the gases.

However, in said projection lens system a second problem presents itself, viz. due to the exorbitant requirements which are imposed on the optical qualifies of this system, variations of air pressure or temperature play an important role. In fact, such variations cause changes in the difference between the refractive index of the lens elements and the refractive index of the spaces between these elements so that the imaging properties of the projection lens system change, as has been described in the article "Atmospheric pressure induced reduction errors in reduction stepper lenses" in SPIE, Vol. 538, Optical Microlithography IV, 1985, pp. 86–90.

To avoid the second problem it has already been proposed, inter alia in U.S. Pat. No. 4,616,908, to fill the projection lens holder with helium. This gas has a very low refractive index so that the refractive index variations due to atmospheric pressure variations are also much smaller. Since helium is very volatile, fresh gas is to be continuously supplied to the projection lens system so that this system is rinsed, as it were, with helium. Instead of helium, another gas having a low refractive index such as neon or nitrogen can also be used for rinsing. When this type of inert gases is used, the contaminating organic particles cannot be convened and depleted so that the contamination problem occurs.

It is not possible to clean an already contaminated lens system by rinsing it in air or oxygen. It could be considered to clean the contaminated lens system by rinsing it in ozone. However, ozone may attack the cladding layers of the lens elements and the material of these elements themselves so that the optical quality of the projection lens system is reduced again.

The problem of contamination may also occur in other optical apparatuses, for example, those apparatuses in which excimer lasers are used, in gas-filled radiation beam transport systems or in military search systems and particularly in high-quality optical systems exposed to ultraviolet radiation.

SUMMARY OF THE INVENTION

It is an object of the present invention to solve this problem and to provide a lens system which includes means preventing contamination. This lens system is characterized in that the gas contains ozone in a concentration of at most several grams per $m^3$.

The invention is based on the recognition that ozone, when used in such a small concentration that it does not attack the lens elements, is capable of preventing the contamination during actual use, i.e. upon passage of UV radiation through the lens system. Moreover, use is made of the fact that the activity of ozone is considerably increased by UV radiation so that the heavily diluted ozone is also capable of cleaning a lens system which is already contaminated.

A preferred embodiment of the lens system according to the invention is further characterized in that the device has a tube which is transmissive to UV radiation and is connected to the lens holder, via which tube a gas having a low refractive index to which oxygen has been added in a concentration of at most 1% by volume is introduced, and a UV radiation source irradiating the tube and emitting radiation at a wavelength of less than 200 nm.

The invention further relates to an apparatus for imaging a mask on a substrate. According to the invention, such an apparatus comprising an illumination unit supplying UV radiation, a mask holder, a projection lens system and a substrate holder, in that order, is characterized in that the projection lens system is a lens system as described hereinbefore.

BRIEF DESCRIPTION OF THE DRAWING FIGURES

These and other aspects of the invention will be apparent from and elucidated with reference to the embodiments described hereinafter.

In the drawings

Figure 2:
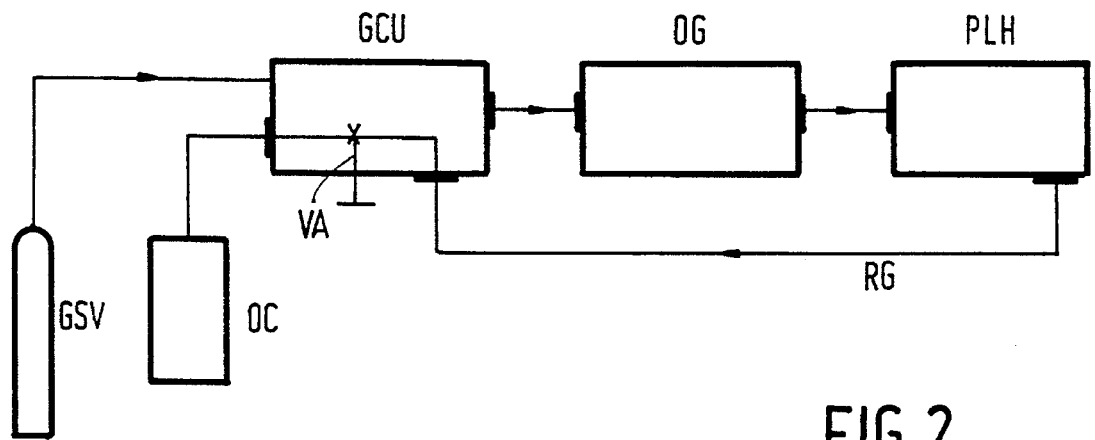
Figure 3:
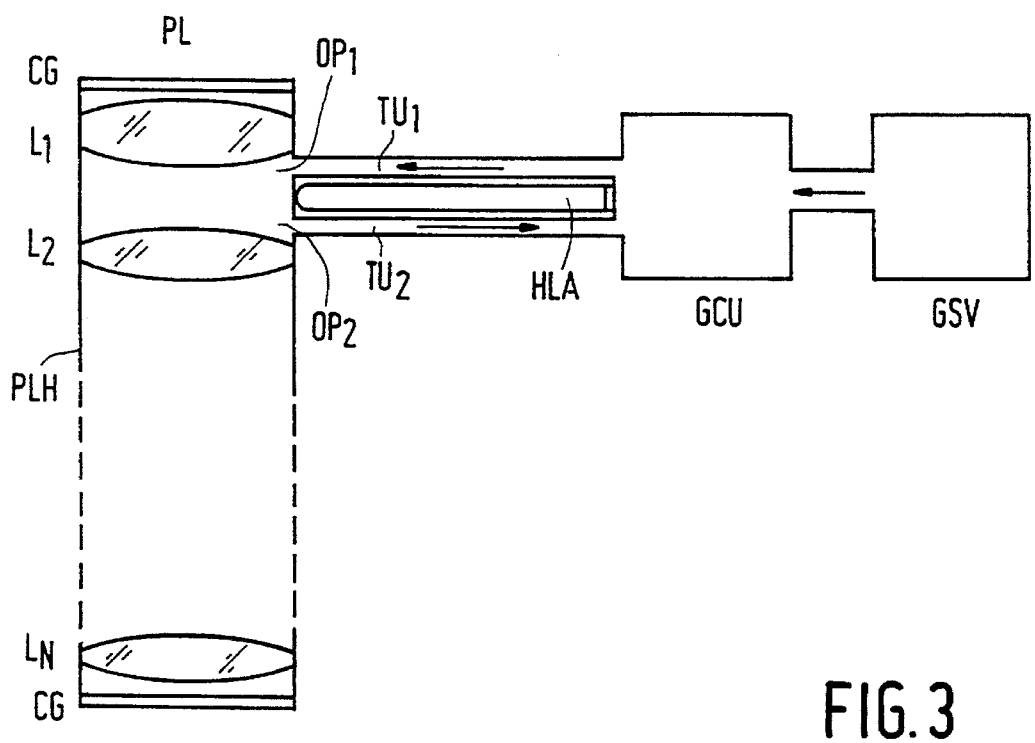

FIG. 1 shows an apparatus for imaging a mask on a substrate, in which apparatus the invention can be used, FIG. 2 illustrates the principle of a lens system according to the invention, and FIG. 3 shows an embodiment of this system.

DESCRIPTION OF THE INVENTION

FIG. 1 shows, very diagrammatically, an apparatus for repetitive imaging of a mask M on a substrate W.

Such an apparatus is described, inter alia in U.S. Pat. No. 5,100,237. This apparatus has an illumination housing LH supplying an actinic illumination beam IB. This beam passes a diaphragm DR and is subsequently incident on the mask M which is arranged on a mask table MT which is adjustable, for example in height in the Z direction. The mask table MT forms part of a projection column PC incorporating also a projection lens system PL which comprises a plurality of lens elements, only two of which, $L_1$ and $L_2$, are shown in FIG. 1. The projection lens system images the mask M on the substrate W which is provided with a photoresist layer (not shown). The substrate is provided on a substrate support WC which forms pan of a substrate table WT on, for example air bearings. The projection lens system has, for example a magnification M=⅕, a numerical aperture NA>0.48 and a diffraction-limited image field with a diameter of, for example, 31 min. The mask table MT is supported, for example, by a granite base plate BP which closes the projection column at its lower side. At its upper side, the projection column is closed by the mask table MT.

The substrate can be displaced in the X, Y and Z directions and rotated, for example about the Z axis with the aid of the substrate table. These displacements are controlled by various servosystems such as a focus servosystem, a, for example X, Y $\phi_z$ interferometer system cooperating with the substrate support, and an alignment system with which mask marks can be aligned with respect to substrate masks. Since these servosystems do not form part of the present invention, they are not shown in the circuit diagram of FIG. 1. Only the alignment beams with their chief rays $AB_1$, $AB_2$ of the alignment system are shown. For further particulars of the projection apparatus reference is made to U.S. Pat. Nos. 5,100,237; 5,144,363 and 5,191,200 and European Patent Applications 0 467 445 and 0 498 499.

The mask must be imaged a number of times, in accordance with the number of ICs to be formed on the substrate, each time on a different area of the substrate. To this end a first substrate area is illuminated via the mask after the substrate has been arranged in the projection column and aligned with respect to the mask. Subsequently, the substrate is moved in the X or Y direction by a distance which is slightly larger than an IC area and a second area is illuminated. This process is repeated until all areas of the substrate have been illuminated.

In the manufacture of ICs it is important that the rate of passage of the substrate through the projection apparatus is as high as possible, i.e. the time necessary for illuminating the complete substrate is as short as possible. This time lapse is inversely proportional to the power of the illumination beam IB from the illumination housing LH. This housing accommodates a radiation source (not visible in FIG.1) which is surrounded by a, for example, elliptical reflector RL, and further, for example, an integrator IN which ensures a homogeneous distribution of radiation within the illumination beam IB of which within the illumination housing, only the chief ray IB is shown, and possibly a condenser lens O. Moreover, the housing may accommodate reflectors $R_a$, $R_2$ which fold the radiation path so that the dimensions of the illumination housing can remain limited.

In order that the illumination time per IC is as short as possible, the radiation source should supply a large power and this source should be cooled. Moreover, it is necessary that a minimal quantity of radiation is absorbed in the projection lens system , i.e. the projection lens elements should have a good transmission. As has been stated in the opening paragraph, the transmission can be considerably affected by formation, via polymerization, of a carbon or a carbon-containing film on the lens elements. Such a film is produced by polymerization, under the influence of the UV illumination beam IB, of organic molecules which are present in the holder of the projection lens system. The transmission of the lens element surfaces does not only decrease, but this decrease is also non-uniform across the surface areas so that also the imaging quality of the lens system is reduced.

According to the invention the formation of such a film on the lens elements, i.e. the contamination of the projection lens system, is prevented by incorporating a very small quantity of ozone in the gas with which this system is rinsed.

FIG. 2 shows the principle of the lens system according to the invention. In this Figure the reference PLH denotes the lens holder accommodating the lens elements. An inert gas, for example helium is applied to this holder from a supply vessel GSV. A gas control unit GCU is arranged between this vessel and the holder PLH. In principle, this unit comprises a pressure control valve VA which reacts to the helium flowing back to the gas control unit from the exhaust opening in the lens holder, via a return lead RG.

To achieve that the gas entering the lens holder comprises a small concentration of ozone, for example several particles of ozone per one million particles of helium, i.e. considerably less than one gram of ozone per $m^3$, oxygen may be added to the helium in the vessel GSV in such a way that a mixture of, for example 99.5% of helium and 0.05% of oxygen is obtained. A part of this oxygen is converted into ozone by means of an ozone generator (OG, see FIG. 1) which may comprise, for example, a mercury vapour lamp.

The system may be provided with an ozone converter OC which converts the remainder of ozone in the helium returned from the lens holder into oxygen again so that no ozone occurs in the exhaust gas.

FIG. 3 shows an embodiment of the lens according to the invention. This Figure is a cross-section of the projection lens system PL comprising a large number of, for example, fourteen lens elements $L_1$-$L_a$ which are arranged in a lens holder PLH. This holder is closed by cover glasses CG at its upper and lower sides or by the upper and lower lens elements, respectively. The lens holder has a supply opening $OP_1$ to which a first tube $TU_1$ is connected through which gas having a low refractive index such as helium or neon is supplied. The lens holder has an exhaust opening $OP_2$ to which a second tube $TU_2$ is connected through which helium can be exhausted. The openings $OP_1$ and $OP_2$ may alternatively be arranged at different heights. The helium, or neon, is so volatile that it spreads throughout the space within the holder LH. A gas stream of, for example 3 liters per hour can be passed through a projection lens system having a free space of 15 liters.

To achieve that the gas entering the lens holder comprises a small concentration of ozone, for example, several particles of ozone per one million particles of helium, oxygen may be added to the helium in the supply vessel in such a way that a mixture of, example 99.5% of helium and 0.5% of oxygen is obtained. On its way to the projection lens holder, a part of this oxygen is converted into ozone by means of an elongated mercury vapour lamp HLA having a low power of, for example 35 W which is arranged between the tubes $TU_1$ and $TU_2$ and irradiates the tube $TU_1$. The tube is made of quartz which is transmissive to the U radiation of the lamp so that this radiation can reach the gas mixture. As is known, a mercury vapour lamp may not only supply UV radiation at a wavelength of, for example 365 nm, but also deep UV radiation having a wavelength of 185 nm. This radiation is capable of converting oxygen into ozone in accordance with:

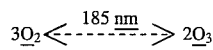

$$3O_2 \underset{\longleftarrow}{\overset{185\ nm}{\longrightarrow}} 2O_3$$

In this way it can be ensured that the gas flowing through the lens holder comprises, for example, three particles of ozone per one million particles of helium for a gas stream of between one and ten liters per hour. This quantity of ozone is sufficient to keep the lens elements satisfactorily clean and to even cleanse them slowly if they should be contaminated. When the projection apparatus is used continuously for a period of five years, the total quantity of ozone which has flowed through the projection lens system will be smaller than the quantity of ozone which would be used if the lens system were cleansed once with pure ozone. This means that the quantity of ozone used according to the invention will not affect the lens quality throughout the economic lifetime of the projection apparatus.

The ozone concentration may alternatively be higher than has been stated hereinbefore, for example several hundred particles per million particles of inert gas without the lens elements being affected. However, such an increase is not necessary to prevent deposits on the lens elements.

The advantage of the embodiment shown in FIG. 3 is that the mercury vapour lamp can easily be replaced, while the medium in the lens holder does not change.

In systems in which lens systems of the type described above are used, optical compensation filters may be used which, after the lens system has been used for sometime, can be arranged in the radiation path so as to convert the non-uniform radiation distribution in the beam produced by contamination into a uniform distribution. By using the invention, the filter may be removed some time after the ozone has had its cleansing effect, which filter subsequently need not be used any longer.

An important additional advantage of the UV radiation-emitting mercury vapour lamp is that it renders possible contaminations in the supply of inert gas harmless and thus filters this gas, as it were, so that it is not only ensured that contaminations in the lens holder do not have a detrimental effect but also fewer contaminations can penetrate the holder.

Instead of being directly formed in the supply lead, the ozone may alternatively be formed elsewhere, for example by means of an electric discharge between two electrodes and injected into the lead via which the inert gas is transported to the lens holder.

The fact that the invention has been explained with reference to an apparatus for repetitive imaging of a mask on a substrate does not mean that it is limited thereto. The apparatus may alternatively be of the "step-and-scan" type in which the mask pattern is scanned with a narrow beam during illumination of each IC area on the substrate so that a projection lens system having a smaller image field can be used. The invention may be further used in a lithographic projection apparatus in which the illumination beam has a different, short wavelength and consists of, for example a g-line radiation having a wavelength of 436 nm. The photolithographic apparatus according to the invention may not only be used for forming IC structures, but also for the manufacture of liquid crystal display (LCD) panel structures. The invention may not only be used in projection apparatuses but also in lens systems for other optical apparatuses in an ambience in which free organic molecules occur and in which the lens system is exposed to ultraviolet radiation.

We claim:

1. A lens system comprising a plurality of lens elements arranged in a lens holder which is connected to a device for maintaining the holder filled with a gas having a refractive index close to 1, wherein the gas contains ozone in a concentration of between several particles to a few hundred ozone particles per million gas particles.

2. A lens system as claimed in claim 1, wherein the device has a tube which is transmissive to UV radiation and is connected to the lens holder, via which tube a gas having a refractive index close to 1 to which oxygen gas has been added in a concentration of at most 1% by volume is introduced, and a UV radiation source irradiating the tube and emitting radiation at a wavelength of less than 200 nm.

3. An imaging apparatus for imaging a mask on a substrate, which apparatus comprises an illumination unit supplying UV radiation, a mask holder, a projection lens system and a substrate holder, in that order, wherein the projection lens system is a lens system as claimed in claim 2.

4. An imaging apparatus for imaging a mask on a substrate, which apparatus comprises an illumination unit supplying UV radiation, a mask holder, a projection lens system and a substrate holder, in that order, wherein the projection lens system is a lens system as claimed in claim 1.

* * * * *